(12) United States Patent
Gambino et al.

(10) Patent No.: US 9,472,483 B2
(45) Date of Patent: Oct. 18, 2016

(54) INTEGRATED CIRCUIT COOLING APPARATUS

(71) Applicant: International Business Machines Corporation, Armonk, NY (US)

(72) Inventors: Jeffrey P. Gambino, Portland, OR (US); Richard S. Graf, Gray, ME (US); Sudeep Mandal, Bangalore (IN); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/802,341

(22) Filed: Jul. 17, 2015

(65) Prior Publication Data

US 2016/0181174 A1 Jun. 23, 2016

Related U.S. Application Data

(63) Continuation-in-part of application No. 14/572,950, filed on Dec. 17, 2014, now Pat. No. 9,184,112.

(51) Int. Cl.
*H01L 23/34* (2006.01)
*H01L 23/367* (2006.01)
*H01L 23/48* (2006.01)
(Continued)

(52) U.S. Cl.
CPC ......... *H01L 23/367* (2013.01); *H01L 21/4871* (2013.01); *H01L 21/563* (2013.01); *H01L 21/76898* (2013.01); *H01L 23/3736* (2013.01); *H01L 23/481* (2013.01); *H01L 25/0657* (2013.01); *H01L 25/50* (2013.01)

(58) Field of Classification Search
CPC ............... H01L 23/367; H01L 23/481; H01L 23/3677; H01L 23/585; H01L 23/49827; H01L 23/5384; H01L 21/486; H01L 21/4871; H01L 21/563; H01L 25/0657; H01L 25/50
USPC ................................ 257/723, 713, 698, 774
See application file for complete search history.

(56) References Cited

U.S. PATENT DOCUMENTS

| | | |
|---|---|---|
| 5,214,000 A | 5/1993 | Chazan et al. |
| 6,770,967 B2 | 8/2004 | Barcley |

(Continued)

OTHER PUBLICATIONS

Lim, S.K., "TSV-Aware 3D Physical Design Tool Needs for Faster Mainstream Acceptance of 3D ICs," Design Automation Conference, DAC.com Knowledge Center Article, 11 pages.

(Continued)

*Primary Examiner* — Tu-Tu Ho
(74) *Attorney, Agent, or Firm* — Nicholas D. Bowman

(57) ABSTRACT

A chip fabricated from a semiconductor material is disclosed, which may include active devices located below a first depth from the chip back side, and a structure to remove heat from the active devices to the chip back side. The structure may include thermally conductive partial vias (TCPVs), which may include a recess with a depth, from the chip back side towards the active devices less than the first depth. Each TCPV may include a barrier layer deposited within the recess and deposited upon the back side of the chip. Each TCPV may also include a thermally conductive layer deposited upon the barrier layer. The structure may also include through-silicon vias (TSVs) electrically connected to active devices, extending from the back side to an active device side of the chip to conductively remove heat from the active devices to the back side of the chip.

13 Claims, 8 Drawing Sheets

(51) Int. Cl.
*H01L 23/373* (2006.01)
*H01L 21/768* (2006.01)
*H01L 21/48* (2006.01)
*H01L 25/00* (2006.01)
*H01L 25/065* (2006.01)
*H01L 21/56* (2006.01)

(56) References Cited

U.S. PATENT DOCUMENTS

| | | |
|---|---|---|
| 7,286,359 B2 | 10/2007 | Khbeis et al. |
| 7,531,407 B2 | 5/2009 | Clevenger et al. |
| 8,174,124 B2 | 5/2012 | Chiu et al. |
| 8,294,261 B2 | 10/2012 | Mawatari et al. |
| 8,410,371 B2 | 4/2013 | Andrews et al. |
| 8,557,639 B2 | 10/2013 | Pagaila et al. |
| 8,587,121 B2 | 11/2013 | Koester et al. |
| 8,680,674 B2 | 3/2014 | McShane et al. |
| 2007/0158787 A1* | 7/2007 | Chanchani .......... B81C 1/00238 257/619 |
| 2007/0235847 A1 | 10/2007 | Ramanathan et al. |
| 2008/0284043 A1* | 11/2008 | Hagen ................ H01L 23/4985 257/777 |
| 2011/0085304 A1 | 4/2011 | Bindrup et al. |
| 2011/0233785 A1* | 9/2011 | Koester ................ H01L 21/768 257/773 |
| 2011/0309513 A1 | 12/2011 | Biegelsen et al. |
| 2012/0168206 A1 | 7/2012 | Sekine et al. |
| 2012/0261819 A1* | 10/2012 | Brunschwiler ....... H01L 21/563 257/738 |

OTHER PUBLICATIONS

Goodnow et al., "Semiconductor Chips Having Heat Conductive Layer With Vias," U.S. Appl. No. 14/138,022, filed Dec. 21, 2013.
Gambino et al., "Integrated Circuit Cooling Using Embedded Peltier Micro-Vias in Substrate," U.S. Appl. No. 14/672,272, filed Mar. 30, 2015.
Gambino et al., "Cooling Apparatus for an Integrated Circuit," U.S. Appl. No. 14/572,950, filed Dec. 17, 2014.
List of IBM Patents or Patent Applications Treated as Related (U.S. Appl. No. 14/802,341, filed Jul. 17, 2015 (present application); and U.S. Appl. No. 14/572,950, filed Dec. 17, 2014).

* cited by examiner

INTEGRATED CIRCUIT COOLING APPARATUS

BACKGROUND

The present disclosure generally relates to cooling of integrated circuits (ICs). In particular, this disclosure relates to using through-silicon vias (TSVs) in conjunction with groups of thermally coupled microvias and/or thermally conductive partial vias (TCPVs) to enhance the cooling of an IC.

A TSV is a vertical electrical connection structure that may pass partially or completely through a semiconductor chip. TSVs may be formed in a semiconductor chip, for example, by using an etching process to create a hole through the chip, depositing an insulating spacer material on the surface of the hole and surrounding semiconductor material, and subsequently filling the hole with an electrically conductive material, such as tungsten, copper or aluminum. The electrically conductive material may be used to connect circuits formed on one planar side of a first semiconductor chip to circuits formed on a second semiconductor chip that is stacked adjacent to the other planar side of the first chip.

A TSV may be useful in enabling stacking and electrical interconnection of multiple IC chips to create high-density circuit structures having relatively short electrical interconnects, high performance, and high density. One such circuit structure, known as a stacked memory device, can include multiple memory chips vertically interconnected to each other, and to a chip that includes logic functions. Stacked memory device logic functions may be used to manage memory operations such as reading, writing, maintenance, and interface with external components, such as a processor chip.

SUMMARY

Various aspects of the present disclosure may be useful for providing an efficient heat transfer path for a three-dimensional integrated circuit (3-D IC). A 3-D IC configured according to embodiments of the present disclosure may have a reduced operating temperature, increased reliability and higher performance relative to a 3-D IC with a less efficient heat transfer path.

Embodiments may be directed towards a chip fabricated from a semiconductor material. The chip may include a plurality of active devices located below a first depth from a back side of the chip, and a structure configured to remove, by conduction from the plurality of active devices to the back side, heat from the chip. The structure may include a plurality of thermally conductive partial vias (TCPVs), each TCPV of the plurality of TCPVs being electrically insulated from the active devices. Each TCPV of the plurality of TCPVs may include a recess with a second depth, from the back side towards the active devices, that is less than the first depth. Each TCPV may also include a barrier layer deposited within at least a portion of the recess and deposited upon at least a portion, adjacent to the recess, of the back side of the chip, the barrier layer having a barrier layer thermal conductivity greater than a semiconductor material thermal conductivity. Each TCPV may also include a thermally conductive layer deposited upon at least a portion of the barrier layer, the thermally conductive layer having a thermal conductivity greater than a semiconductor material thermal conductivity. The structure may also include a plurality of through-silicon vias (TSVs) electrically connected to the active devices, extending from the back side to an active device side of the chip and configured to remove, by conduction from the active devices to the back side, heat from the chip.

Embodiments may also be directed towards a method for assembling a 3-D IC having a composite heat removal structure. The method may include placing, onto a substrate, a first chip having a first heat removal structure. The first heat removal structure may include a first plurality of TCPVs and a first plurality of TSVs. The method may also include bonding the first chip to the substrate and placing, onto the first chip, a second chip having a second heat removal structure. Second heat removal structure may include a second plurality of TCPVs and a second plurality of TSVs. The method may also include bonding, to create a 3-D IC with a composite heat removal structure that includes the first heat removal structure and the second heat removal structure, the second chip to the first chip.

Embodiments may also be directed towards a method for fabricating, within a chip having a plurality of active devices formed in a semiconductor material and located below a first depth from a back side of the chip, a structure for removing heat from the chip. The method may include forming, in the back side of the chip, a plurality of recesses each having, from the back side towards the plurality of active devices, a second depth that is less than the first depth. The method may also include depositing a barrier layer having a barrier layer thermal conductivity greater than a semiconductor material thermal conductivity into the plurality of recesses and onto at least a portion, adjacent to the recesses, of the back side of the chip. The method may also include forming, by depositing a thermally conductive layer having a thermal conductivity greater than a semiconductor material thermal conductivity onto at least a portion of the barrier layer, a plurality of TCPVs. The method may also include forming, in the chip, a plurality of TSVs electrically connected to the active devices, wherein each TSV extends from the back side to an active side of the chip and is configured to remove heat from the chip.

Aspects of the various embodiments may be used to efficiently remove heat generated during operation of chips within a 3-D IC. Aspects of the various embodiments may also be useful for creating cost-effective cooling structures for use with 3-D ICs, by using existing and proven materials, IC design and fabrication technologies. Embodiments of the present disclosure may be used in conjunction with ICs fabricated using either a "via first" or a "via last" design methodology.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
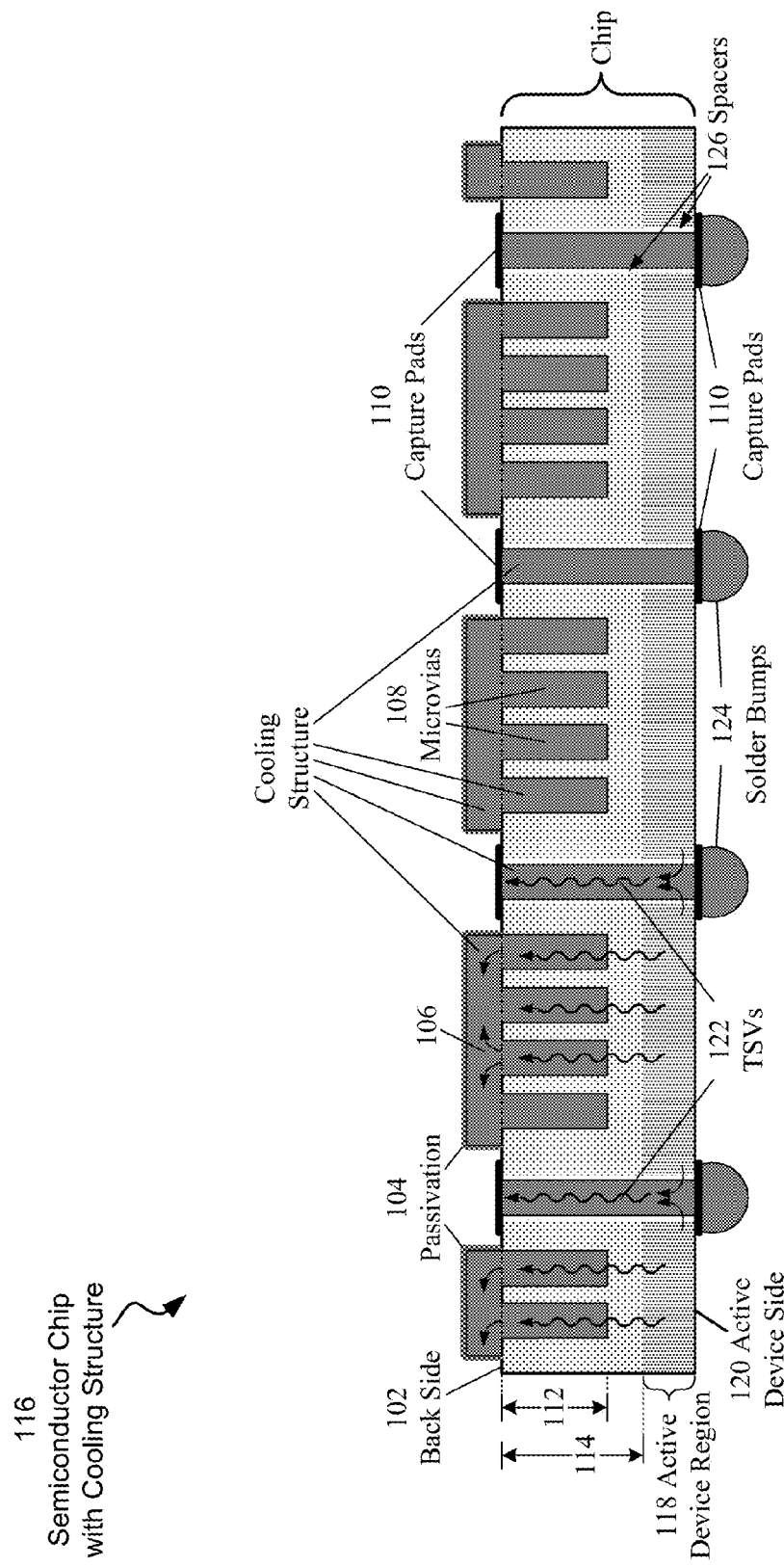
FIG. 1 is a cross-sectional drawing depicting a structure for cooling a semiconductor chip, according to embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of providing an enhanced, efficient thermal path for the removal of heat during the operation of a three-dimensional integrated circuit (3-D IC) which may include processor and/or memory chips created using a "via first" fabrication process. Such integrated circuits (ICs) may be used to provide enhanced computational capability to electronic equipment such as personal computers, servers and high-performance computing devices. Such electronic equipment may be used in desktop computing, file serving, special-purpose computing and network applications. While not necessarily limited thereto, embodiments discussed in this context can facilitate an understanding of various aspects of the disclosure.

Certain embodiments may also be directed towards other equipment and associated applications, such as providing an enhanced and efficient thermal path for the removal of heat during the operation of a 3-D IC created using a "via last" fabrication process. Such ICs may be used to provide enhanced processing capability to electronic equipment such as personal computers, servers and high-performance computing devices. Embodiments may also be directed towards providing an enhanced and efficient thermal path for the removal of heat from a 3-D IC which may include processor and/or image sensor chip. Such ICs may be used to provide enhanced image capture and processing capability to electronic equipment such as digital image and video sensor devices. Such sensor devices may be used in digital still image and video cameras, cell phones and tablet devices.

For simplicity of discussion, embodiments of the present disclosure may be generally discussed and illustrated herein with reference to a "via first" design and fabrication methodology. A "via first" design and fabrication methodology may include creation of through-silicon vias (TSVs) prior to certain other fabrication operations such as the fabrication of active devices, e.g., transistors, or electrical interconnect structures, e.g., wiring. Certain embodiments may also be practiced with and useful in conjunction with "via last", "via middle" or other design and fabrication methodology types. A "via last" design and fabrication methodology may include creation of TSVs following other fabrication steps such as active device and electrical interconnect fabrication.

The creation of 3-D ICs through stacking and electrically interconnecting chips with TSVs and solder bumps or other interconnect structures such as copper pillars may result in a high level of device integration and electrical performance. A 3-D IC may include, in close proximity, multiple chips which may each dissipate a significant amount of heat. For example a single processor chip may dissipate more than 100 W during operation, and an entire 3-D IC may be capable of dissipating 500 W or more during operation. In certain applications, a heat sink or other heat dissipation device may be attached to the top and/or a bottom of a 3-D IC to remove heat generated by chips within the 3-D IC. A relatively large amount of heat dissipated by chips within a 3-D IC, in conjunction with thermal resistance of the chips/semiconductor material and inter-chip interfaces, may result in retention of heat and subsequent elevation of chip temperature(s) within the 3-D IC. Chip temperatures that remain elevated above a specified maximum temperature may result in a reduction of chip performance and reliability.

Various embodiments of the present disclosure relate to an IC cooling structure configured to be fabricated within a semiconductor chip. The IC cooling structure may therefore be useful for providing and efficient thermal path for removal of heat during operation of the IC. A planar arrangement of multiple ICs, each IC containing an integrated IC cooling structure, to form a 3-D IC, may align and connect the IC cooling structures to enable efficient and effective heat transfer from ICs within the 3-D IC to an exterior surface of the 3-D IC, e.g., top and/or bottom surface.

Various embodiments of the present disclosure may utilize a combination of backside thermally conductive partial vias (TCPVs) and microvias/patterned regions of plated thermally conductive material to improve the heat transfer within an individual IC and/or a 3-D IC. These structures may be employed in conjunction with thermal conduction from TSVs to enhance thermal transfer through a single IC/chip and between chips in 3-D IC, which may include stacked TSV structures. Microvias and TCPVs may provide improved heat transfer from active heat-producing devices to the thermally conductive material regions, without consuming valuable semiconductor material area, which may be useful for active device fabrication, on the active device side of the chip.

For ease of discussion, the terms "chip" and "wafer" may be used herein in reference to a semiconductor material used to form an IC. It may be understood that for the sake of discussion these terms may be used interchangeably without loss of meaning.

According to embodiments, a chip cooling structure that limits thermal resistance within a 3-D IC by providing an efficient thermal path may be useful in effectively transferring heat from heat-producing chip within the 3-D IC to a heat removal device. In certain embodiments, efficient heat transfer from a 3-D IC may result in a lower device/chip operating temperature range and increased 3-D IC and system reliability. According to certain embodiments, efficient heat transfer from a 3-D IC may allow the IC to dissipate an increased amount of heat, which may allow the IC to be operated at a higher frequency and yield higher device and/or system performance, relative to an IC having less efficient heat transfer. A chip cooling structure according to embodiments may be fabricated using existing and proven fabrication materials and technologies, and may also be cost-effective, smaller and lighter than other types of 3-D IC cooling devices.

Certain embodiments relate to increasing the efficiency of heat removal from an IC through the use of back side microvias connected by a patterned, thermally conductive material layer. FIG. 1 is a cross-sectional drawing depicting a structure for cooling a semiconductor chip 116, according to embodiments of the present disclosure. The semiconductor chip cooling structure includes microvias 108, patterned regions of thermally conductive material 106 and TSVs 122.

Microvias 108 may provide a thermal path having relatively high thermal conductivity, which may be useful in conducting heat produced by active devices, e.g., transistors, within the active device region 118 towards thermally conductive material regions 106 on the back side 102 of the chip 116. In embodiments, patterned regions of thermally conductive material 106 may spread heat conducted by microvias 108. In certain embodiments, regions 106 may be used as thermally conductive interfaces to transfer heat away from active devices to a heat removal device, e.g., heat sink, or a chip adjacent to back side 102 of chip 116. In certain embodiments, thermally conductive material 106 may be positioned to interface with an adjacent stacked chip similar to chip 116, which may enable further heat conduction away from the active devices. TSVs 122 may be used to conduct heat from the active device side 120 to the back side 102 of chip 116, and may be useful, when bonded to another TSV or heat removal structure, in conducting heat to the TSV or structure.

Microvias 108, thermally conductive material regions 106 and TSVs 122 may be fabricated from one or more materials having a thermal conductivity significantly greater than a semiconductor material, e.g., silicon. For example, copper, which may be used to fabricate TSVs, microvias and patterned thermally conductive regions, may have a have a thermal conductivity of approximately 401 W/m*K, while monocrystalline silicon may have a thermal conductivity of approximately 149 W/m*K. The relatively high thermal conductivity of these structures may be useful in significantly decreasing thermal resistance, and therefore increasing conductive heat flow, between active/heat-producing devices in active device region 118 and an exterior surface, e.g., back side 102, of a chip 116 or a 3-D IC.

The close proximity of microvias 108 to active device region 118 may be useful in providing an efficient thermal path for the removal of heat produced by active devices, e.g., transistors, within active device region 118.

Microvias 108 are depicted having a second depth 112 from the back side 102 of chip 116 that is less than a first depth 114 of an active device region 118. The difference between the second depth 112 and first depth 114 defines the thickness of a layer of electrically and thermally insulative, relative to microvias 108, semiconductor material between the active devices and the microvias 108. A thicker layer may be specified to provide adequate electrical insulation between the microvias 108 and active circuits, in active device region 118, while a thinner layer can lower the relatively thermally insulative, relative to microvias 108, effects between active circuits and microvias 108. The electrical insulation can be particularly useful because it can allow for the use of various microvia fill materials that are efficient electrical and thermal conductors. Accordingly, both the electrical insulation and thermal insulation effects can be considered when specifying the desired thickness.

In certain embodiments, a plurality of patterned regions of thermally conductive material 106 may be formed on the back side of the first chip 116 to be in thermally conductive contact with groups of microvias 108. Thermally conductive material 106 may include copper, aluminum or other materials having a higher thermal conductivity than a semiconductor material such as silicon. In some embodiments, regions 106 may be formed from a material similar to the material used to form microvias 108, and in some embodiments a different material may be used. Regions 106 may be patterned and positioned to provide a thermally conductive interface between a chip and a heat removal device such as a heat sink or another chip. In embodiments, the thickness of regions 106 may be specified to provide robust heat transfer/spreading across chip 116 and vertically to another chip or heat removal device. In certain embodiments, regions 106 may be useful in as power distribution structures, and may be used, for example, as power or ground connection nodes.

In embodiments, each region 106 may include a passivation layer 104 such as $SiO_2$, polyimide or silicon nitride deposited on exposed surfaces, e.g., top and sides, of the region 106. A passivation layer 104 may provide electrical insulation from other adjacent electrically conductive layers, as well as resistance to moisture and corrosion of metals which may be used for thermally conductive regions 106.

TSVs 122 may, in embodiments, extend from the active device side 120 to the back side 102 of chip 116, and may be electrically connected to active devices in active device region 118. TSVs 122 may be used to conduct signals and power and may be configured to remove, by conduction from the active devices to the back side, heat from the first chip 116. In certain embodiments, the fill material within a TSV may be physically isolated and electrically insulated from a semiconductor material by spacers 126. In certain embodiments, a "barrier" metal, e.g., Ti/Cu, may be deposited on the interior of a TSV recess to prevent the diffusion of metal, e.g., copper, from a TSV fill material into semiconductor material such as silicon.

In certain embodiments, solder bumps 124 can be formed on capture pads 110 that are attached to TSVs at the active device side of the first chip. In certain embodiments, solder bumps may be useful in electrically connecting a chip to a substrate, or to another chip, and may also be useful for providing a conductive path for the transfer of heat from a chip to an adjacent chip or substrate. In particular embodiments, copper pillars in conjunction with a layer of solder at each connecting end of the pillar may be used in place of solder bumps. In certain embodiments, copper pillars may have particular electrical, mechanical and reliability advantages, such as increased electrical and thermal conductivity, and increased mechanical stability, relative to solder bumps. For ease of discussion herein, the term "solder bumps" may be used to describe an electrically and thermally conductive interconnect structure, however it may be understood that in many applications, copper pillars may also be used as effective interconnect structures.

In certain embodiments, capture pads, e.g., 110, and corresponding solder bumps 124 can be arranged on a back side 102 of a chip, similarly to the active device side 120 arrangement described. An arrangement of capture pads 110 on either an active device side 120, or a back side 102 of a first chip 116 may be specified to correspond to a similar capture pads arrangement on a second chip, to facilitate accurate bonding of corresponding sets of capture pads 110 with solder bumps 124.

Figure 1A:
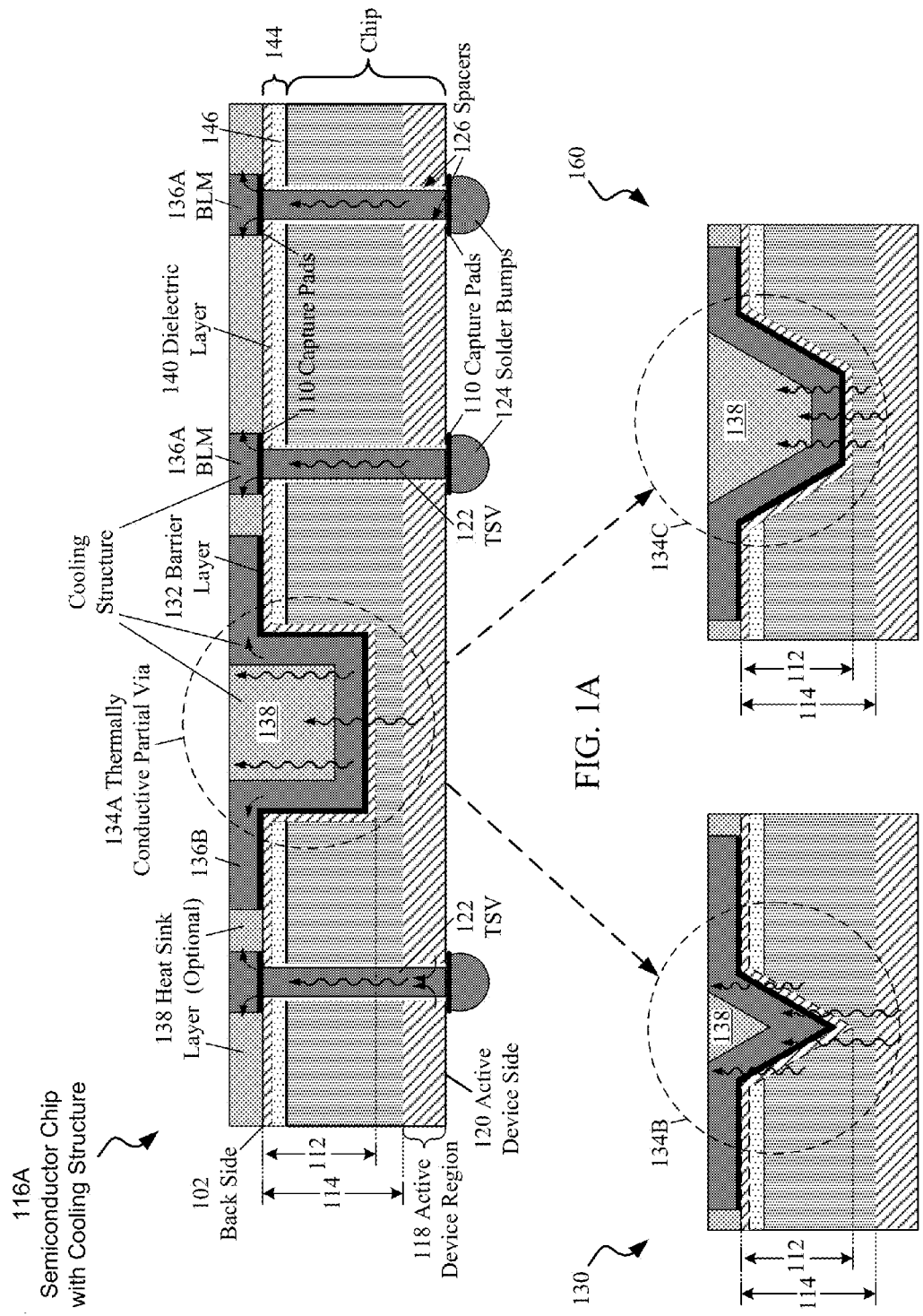
FIG. 1A is a set of cross-sectional drawings depicting structures for cooling a semiconductor chip, according to embodiments of the present disclosure.

FIG. 1A includes a cross-sectional drawing 116A depicting a semiconductor chip with a cooling structure, according to embodiments of the present disclosure consistent with FIG. 1. The semiconductor chip cooling structure includes TCPVs 134A, 134B and 134C, and TSVs 122.

TCPVs 134A, 134B and 134C may provide a thermal path having relatively high thermal conductivity, which may be useful in conducting heat produced by active devices such as transistors, within the active device region 118 towards thermally conductive material layer 136B and heat sink layer 138 on the back side 102 of the chip 116A. In embodiments, thermally conductive material layer 136B and heat sink layer 138 may spread heat conducted by TCPVs 134A, 134B and 134C. In certain embodiments, thermally conductive material layer 136B and heat sink layer 138 may be used as thermally conductive interfaces to transfer heat away from active devices to a heat removal device, e.g., an attached heat sink, or a chip adjacent to back side 102 of chip 116A. In certain embodiments, thermally conductive material layer 136B and heat sink layer 138 may be positioned to interface with an adjacent stacked chip, similar to chip 116A, which may enable further heat conduction away from the active devices.

TCPVs 134A, 134B and 134C, thermally conductive material layer 136B, heat sink layer 138 and TSVs 122 may be fabricated from one or more materials having a thermal conductivity significantly greater than a semiconductor material such as silicon. For example, copper, which may be used to fabricate TSVs and thermally conductive material layers 136B, may have a have a thermal conductivity of approximately 401 W/m*K, while monocrystalline silicon may have a thermal conductivity of approximately 149 W/m*K. In certain embodiments, aluminum may also be used in a thermally conductive material layer, e.g., 136B. Similarly, aluminum nitride, which may be used in certain embodiments as a dielectric layer 140, and as a heat sink layer 138, may have a have a thermal conductivity of approximately 280 W/m*K. The relatively high thermal conductivity of these layers may be useful in significantly decreasing thermal resistance, and therefore increasing conductive heat flow, between active/heat-producing devices in active device region 118 and an exterior surface such as back side 102 of a chip 116A or a 3-D IC.

The close proximity of TCPVs 134A, 134B and 134C to active device region 118 may be useful in providing an efficient thermal path for the removal of heat produced by active devices such as transistors within active device region 118. TCPVs 134A, 134B and 134C are depicted having a second depth 112 from the back side 102 of chip 116A that is less than a first depth 114 of an active device region 118. The difference between the second depth 112 and first depth 114 defines the thickness of a layer of electrically and thermally insulative, relative to TCPVs 134A, 134B and 134C, semiconductor material between the active devices and the TCPVs 134A, 134B and 134C. A thicker semiconductor material layer may be specified to provide adequate electrical insulation between TCPVs 134A, 134B and 134C and active circuits, in active device region 118, while a thinner semiconductor material layer can lower the relatively thermally insulative effects, relative to TCPVs 134A, 134B and 134C, between active circuits and TCPVs 134A, 134B and 134C. The electrical insulation provided by a semiconductor material layer can be particularly useful because it can allow for the use of various TCPV fill materials that are efficient electrical and thermal conductors. Accordingly, both the electrical insulation and thermal insulation effects can be considered when specifying the desired semiconductor material thickness, i.e., depth 114 minus depth 112.

A number of etching processes may be used to create a variety of cross-sectional shapes of recesses in semiconductor material for TCPVs, as depicted in views 130 and 160. In certain embodiments, TCPVs, for example, 134A, may have a cylindrical shape, including a cross-section that includes two vertical sides, with each of the vertical sides intersecting with a horizontal bottom surface. In certain embodiments, TCPVs such as 134B may have a "V" shape, including a cross-section that includes two intersecting sloped sides, and that is formed by an anisotropic etch process. In certain embodiments, TCPVs such as 134C may have a "U" shape, including a cross-section that includes two sloped sides, each of the sloped sides intersecting with a horizontal bottom surface, and that is formed by an anisotropic etch process. An anisotropic etch process may include the use of etchants such as tetramethylammonium hydroxide (TMAH), depending on a semiconductor material structure. According to embodiments, the various TCPV shapes depicted in FIG. 1A may each have unique thermal properties and advantages.

Dielectric layer 144 may include an electrically insulative material layer 146, such as $SiO_2$, deposited on the chip 116A, and in certain embodiments, dielectric layer 144 may also include a layer of electrically insulative, thermally conductive material layer 140, such as aluminum nitride.

In certain embodiments, a thermally conductive "barrier" layer 132 such as titanium, titanium nitride or tungsten may be deposited on the interior of a TCPV recess to inhibit diffusion of thermally conductive material, e.g., copper or aluminum, into the semiconductor material, e.g., silicon. In certain embodiments, a barrier layer 132 may also be deposited on at least a portion of the dielectric layer 144 on the chip back side 102 adjacent to the recess. A barrier layer 132 may be useful, due to a barrier layer thermal conductivity that is greater than a semiconductor material thermal conductivity, in conducting and spreading heat towards and across the back side 102 of chip 116A.

In certain embodiments, a plurality of patterned areas of thermally conductive material layer 136B may be formed upon at least a portion of the barrier layer 132 on the back side of the chip 116A to be in thermally conductive contact with TCPVs 134A, 134B and 134C. Thermally conductive material layer 136B may include copper, aluminum or other materials having a higher thermal conductivity than a semiconductor material such as silicon. In some embodiments, thermally conductive material layer 136B may be formed from a material similar to the material used to form TCPVs 134A, 134B and 134C, and in some embodiments a different material may be used. Thermally conductive material layer 136B and heat sink layer 138 may be patterned and positioned to provide a thermally conductive interface between a chip and a heat removal device such as a heat sink or another chip. In embodiments, the thickness of thermally conductive material layer 136B and heat sink layer 138 may be specified to provide robust heat transfer/spreading across chip 116A and vertically to another chip or heat removal device. In certain embodiments, thermally conductive material layer 136B may be useful in as power distribution structures, and may be used, for example, as power or ground connection nodes.

In certain embodiments, thermally conductive material may be deposited on portions of barrier layer 132 connected to TSVs 122, and may be useful as ball-limiting metallurgy (BLM) structures. BLM structures may be used as solder ball/bump attachment points, and to constrain the size and position of solder balls or bumps attached to BLM structures.

In certain embodiments, a heat sink material layer 138 such as aluminum nitride may be deposited on the back side 102 of chip 116A and within at least a portion of the recess formed for the TCPV.

Figure 2:
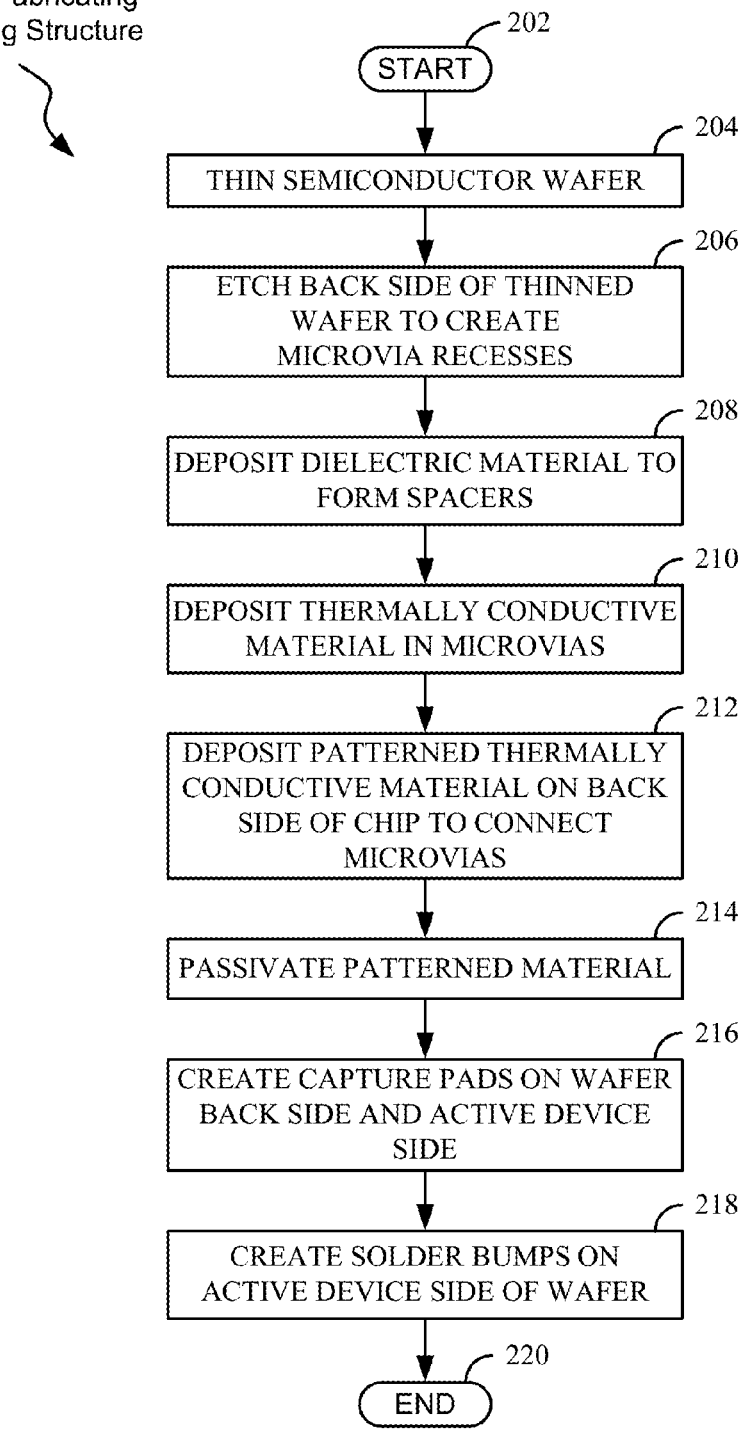
FIG. 2 is a flow diagram of a method for fabricating a structure for cooling an integrated circuit (IC), according to embodiments consistent with FIG. 1.

FIG. 2 is a flow diagram of a method for fabricating, within an IC chip, a structure for cooling the IC, according to embodiments consistent with FIG. 1. The method for fabricating a structure for cooling an IC 200 may be useful for creating IC cooling structures that are compatible with existing IC material sets and fabrication technologies. The method 200 may be used in conjunction with various IC fabrication processes and methodologies such as "via first" and "via last", and may be used with chips having a plurality of active devices formed in a semiconductor material located below a first depth from a back side of the chip. The operations of method 200 may generally correspond to the views provided by FIG. 3 and their associated descriptions. The process 200 moves from start 202 to operation 204.

Figure 3:
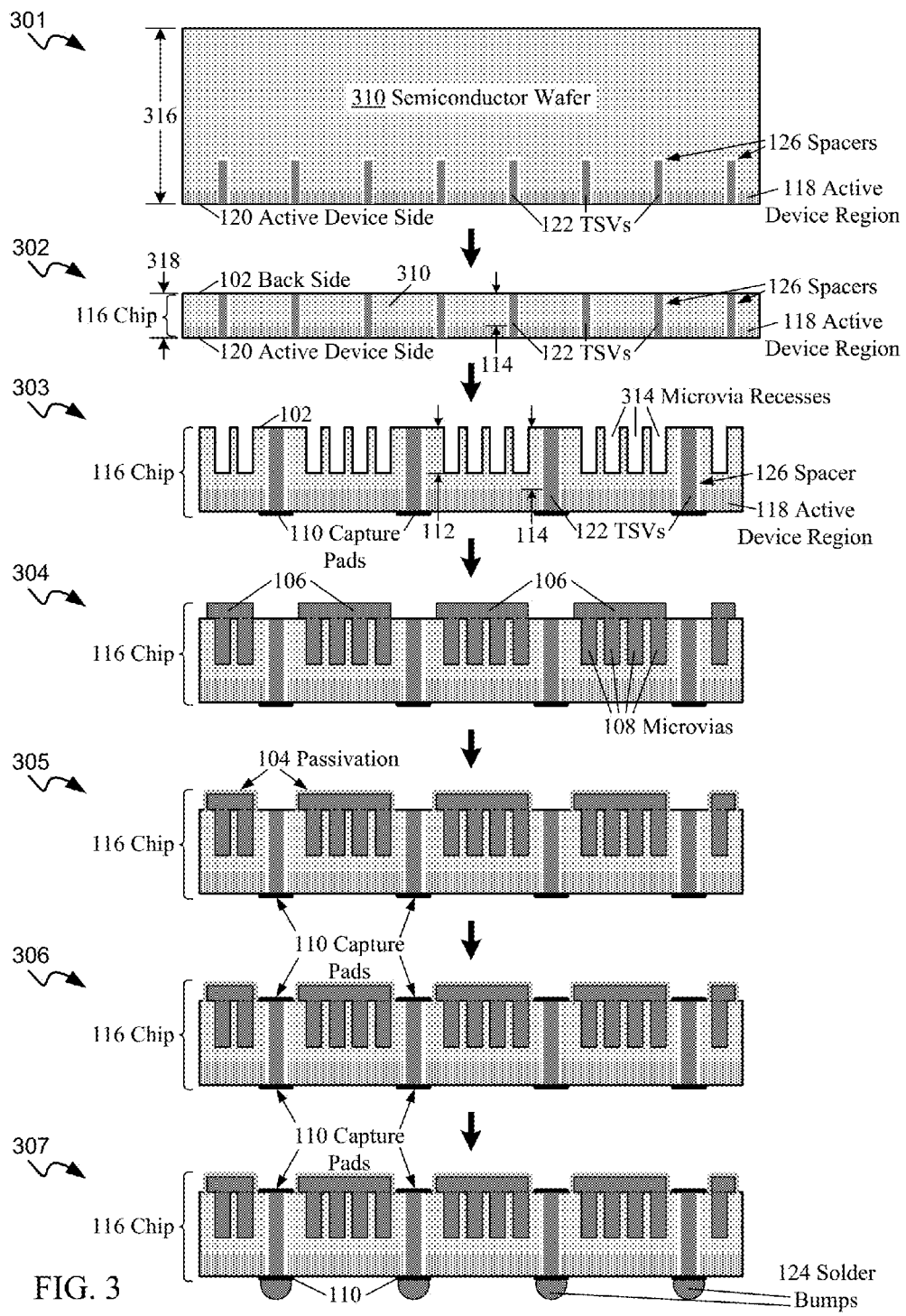
FIG. 3 includes seven cross-sectional views illustrating the results of process steps for fabricating an IC cooling structure, according to embodiments.

Operation 204 generally refers to the process steps that involve thinning a semiconductor wafer or chip, from a first thickness to a second thickness less than the first thickness, which may correspond to view 302, FIG. 3, and its associated description. Thinning a semiconductor wafer may be useful for exposing, on a back side of the chip, ends of TSVs created using a "via first" fabrication process. In a "via last" chip fabrication process, thinning a semiconductor wafer may be a useful operation prior to creating recesses in the wafer for TSVs. Exposing both ends of a TSV may be useful for creating connection locations for solder bump capture pads that are physically and electrically bonded to the TSV. A semiconductor wafer thickness may be, for example, in a range between 600 µm and 900 µm, before thinning, and in a range between 50 µm and 150 µm after a thinning operation. Once the semiconductor wafer or chip has been thinned, the process moves to operation 206.

Operation 206 generally refers to the process steps that involve forming, in the back side of the thinned chip, a plurality of microvia recesses, which may correspond to view 303, FIG. 3, and its associated description. In a "via first" chip fabrication process, forming a plurality of recesses may include forming recesses to receive a microvia fill material. In a "via last" chip fabrication process, forming a plurality of recesses may include forming microvia recesses and TSV recesses, within a thinned chip or wafer. Microvia recesses may each have a second depth, from the chip back side towards the active devices, that is less than the first depth of the active device region from the chip back side. Via recesses formed in a "via last" fabrication process may extend from a back side of a chip to an active device side of the chip. Created microvia and via recesses may be useful for allowing thermally conductive material to be placed in close proximity to active devices, which may facilitate efficient heat transfer from the active devices.

The second depth of formed microvia recesses may be specified to provide an electrically insulative layer of semiconductor material between active devices in an active device region and the plurality of microvias. The thickness of this semiconductor material layer can be sufficient to prevent electrical interactions, while providing an efficient thermal path, between devices in the active device region and the plurality of microvias. For example, in certain embodiments, a minimum distance between a microvia recess and an active device region may be in a range between 2 µm and 20 µm. This distance may correspond to the difference in depths 112 and 114, as illustrated in FIG. 1.

In particular embodiments, a second depth of a particular microvia recess may be different than a second depth of another microvia recess, as a result of variations in a microvia recess etching process. In certain embodiments, a second depth of a particular microvia recess may be specified to be different than a second depth of another microvia recess, for example, to accommodate two or more different depths 114, FIG. 1, of two or more corresponding active device regions, e.g., 118, FIG. 1. Once a plurality of recesses has been formed, the process moves to operation 208.

Operation 208 generally refers to the process steps that involve depositing, in a "via last" chip fabrication process, a dielectric material to form electrically insulative spacers between a recess in the semiconductor material and a TSV fill material. Spacers 126 are illustrated in views 301-303 of FIG. 3. TSV spacers may be useful for electrically insulating electrically conductive TSV fill material from a semiconductor material in which a TSV recess is formed. Insulating TSVs from semiconductor material may eliminate current leakage from a TSV to a semiconductor material, which may enhance the performance and operational stability of active devices formed in the semiconductor material. Once electrically insulative spacers have been formed, the process moves to operation 210.

Operation 210 generally refers to the process steps that involve placing fill material into the plurality of recesses to form thermally conductive microvias, which may correspond to view 304, FIG. 3, and its associated description. In a "via last" chip fabrication process, operation 210 may also include filling TSV recesses with fill material to form electrically and thermally conductive TSVs. Forming thermally conductive microvias and TSVs may be useful for creating an efficient thermal path between active devices and a back side of the chip. Once thermally conductive microvias have been formed, the process moves to operation 212.

Operation 212 generally refers to the process steps that involve creating thermally conductive material regions on the back side of the chip. Each thermally conductive region may connect a set of thermally conductive microvias formed in operation 210, which may correspond to view 304, FIG. 3, and its associated description. Connecting microvias with thermally conductive regions may be useful in spreading heat conducted, from active devices, by the microvias, and in providing a surface used to conduct heat to another chip or heat removal device such as a heat sink. Once thermally conductive material regions are created, the process moves to operation 214.

Operation 214 generally refers to the process steps that involve depositing a passivation layer on exposed surfaces of the patterned thermally conductive material regions, which may correspond to view 305, FIG. 3, and its associated description. A passivation layer such as $SiO_2$, polyimide or silicon nitride may be deposited on exposed surfaces, e.g., top and sides, of the thermally conductive material regions, and may be useful for electrically insulating them from other electrically conductive layers. Passivation may also be useful to provide resistance to moisture and corrosion of metals which may be used for thermally conductive material regions. Once a passivation layer is deposited, the process moves to operation 216.

Operation 216 generally refers to the process steps that involve forming capture pads on the back side and the active side of the chip which may correspond to views 303, 306, FIG. 3, and their associated descriptions. Capture pads may be useful as electrically and thermally conductive connections to a chip, through which signals may be transmitted and heat conducted. Capture pads of a first chip may be arranged to correspond to a capture pads arrangement on a second chip or a substrate, and may be useful for creating a large number of electrically and thermally conductive connections within stacked a 3-D IC device. Once capture pads have been formed, the process moves to operation 218.

Operation 218 generally refers to the process steps that involve attaching a plurality of solder bumps to the active side of the chip which may correspond to the view 307, FIG. 3, and its associated description. Solder bumps may be useful in creating electrically and thermally conductive connections between corresponding sets of capture pads on adjacent chips or on a chip placed adjacent to a substrate. After the solder bumps are attached to the active side of the chip, the process 200 may end at block 220.

FIG. 3 includes seven cross-sectional views 301-307 illustrating the results of a sequential set of process steps for fabricating, within a chip 116, a cooling structure for removing heat from the chip, according to embodiments of the present disclosure consistent with the figures. The chip may have a plurality of active devices formed in a semiconductor material 120, which may be located in an active device region 118, below a first depth from a back side of the chip. These views illustrate an example process; other views and steps may be possible. The results of one or more process steps may be depicted in each view. For example, a view may depict the results of creating microvia recesses, e.g., 314, view 303, which may include related photomask deposition and patterning, etching and photomask removal steps. Processing steps associated with views 301 through 307 may include, but are not limited to, chemical-mechanical polishing (CMP), photomask deposition and patterning, etching, photomask removal, metal deposition, passivation and solder bump attachment.

The progression depicted in views 301 through 307 begins with a semiconductor wafer 310 with an active device region 118, view 301, and TSVs 122, view 301, and ends with chip 116, view 307, having a cooling structure including microvias 108, patterned thermally conductive material regions 106, and TSVs 122. For simplicity of illustration, completed structures are generally shown in the views as having rectangular cross-sectional profiles, with surfaces orthogonal to each other. This depiction, however, is not limiting; structures may be of any suitable shape, size and profile, in accordance with specific design criteria, lithographic and assembly process limitations and tolerances for a given application. For example, corners shown as having right angles may be rounded, surfaces may have a non-orthogonal relative orientation, and relative dimensional ratios may vary from those depicted in the figures. Views 301 through 307 illustrate the process of manufacturing a cooling structure in a single chip 116, however, in embodiments, a plurality of cooling structures may be simultaneously manufactured within multiple chips within a semiconductor wafer, e.g., 310.

View 301 depicts a semiconductor wafer 310, having a generally planar shape, a first thickness 316, and an active device region 118 adjacent to the active device side 120. TSVs 122 may be, in a "via first" fabrication process, formed in the semiconductor wafer 310 from the active device side 120, and may be electrically insulated from the semiconductor wafer 310 by electrically insulative spacers 126. Spacers 126 may be formed, from an electrically insulative material such as $SiO_2$, between the semiconductor material 310 and a TSV fill material. Semiconductor wafer 310 may be formed from a semiconductor material such as silicon, silicon germanium, silicon carbide or gallium arsenide. First thickness 316 may represent the thickness of a semiconductor wafer before any process steps which may alter its thickness. In embodiments, TSVs 122 may have a cylindrical shape, and a diameter, depth and aspect ratio consistent with via dimensions for particular chip fabrication and etching technologies. TSVs 122 may be formed by filling a plurality of TSV recesses with an electrically and thermally conductive (fill) material such as copper, aluminum, nickel, tungsten or polysilicon, and may be electrically connected to active devices, e.g., transistors, within active device region 118. TSVs 122 may extend from the active device side of the chip and may be configured to convectively remove heat from the chip.

View 302 depicts the results of thinning a semiconductor wafer 310 from a first thickness 316 to a second thickness 318 that is less than the first thickness 316. A thinning operation may, for example, involve a CMP process, or other etching or mechanical material removal process. A thinning operation, in a "via first" fabrication process, may expose the TSVs 122 at the back side 102 of the chip 116. TSVs 122 that are exposed at both an active device side 120 and a back side 102 of the chip 116 may be useful for conducting heat through the chip and conducting electrical signals between chip 116 and an adjacent chip. The first depth 114 represents a distance from back side 102 to an active device region 118 of chip 116.

View 303 depicts the results of forming, in the back side 102 of chip 116, a plurality of microvia recesses 314, each recess having a second depth 112, from the back side 102 towards the active devices, that is less than the first depth 114 of active device region 118. Views 303-307 are depicted as enlarged relative to views 301-302, in order to depict the details of features such as microvias 108 and TSVs 122. In a "via last" fabrication process, forming the plurality of TSVs may also include forming a respective plurality of TSV recesses. Microvia recesses 314 and TSV recesses may be formed through the use of photomask deposition and patterning, etching, and photomask removal operations. In embodiments, an etching operation may include wet chemical etching or dry plasma etching steps. Photomask techniques and materials may be specified to be compatible with a particular etching technology. The duration and resulting depth of an etching operation may be tightly controlled in order to limit the depth 112 of microvia recesses 114 to be less than a depth 114 of the active device region 118.

View 304 depicts the results of forming a plurality of thermally conductive microvias 108 in microvia recesses 314, view 303, and connecting sets of microvias 108 together with regions of thermally conductive material 106. Thermally conductive microvias 108 may be formed by depositing a diffusion barrier layer followed by a seed metal layer, prior to depositing a fill material. Metal combinations for diffusion barrier/seed layers may include Ti/Cu, Ti/Co, Ti/Ru, Ti/Cr, and Ti/Cr/Au. Following the deposition of the diffusion barrier and seed layers, a fill material having a fill thermal conductivity greater than a semiconductor material thermal conductivity is deposited into the plurality of microvia recesses 314, view 303. A microvia fill material may include copper, aluminum, nickel, tungsten or polysilicon.

Regions of thermally conductive material 106 may be formed on the back side 102 of chip 116, and may be useful in providing a thermally conductive path between connecting sets of microvias 108. In a "via last" fabrication process, a plurality of TSVs may be formed by filling a plurality of TSV recesses with a thermally and electrically conductive TSV fill material such as copper, aluminum, nickel, tungsten or polysilicon. In embodiments, a TSV fill material may have a thermal conductivity greater than a semiconductor material thermal conductivity.

Filling microvia recesses 314 and creating patterned regions of thermally conductive material 106 may include the use of photomask deposition and patterning, material deposition, and photomask removal operations. In embodiments, a material deposition operation may include chemical vapor deposition (CVD), sputtering, or electroplating operations. Photomask techniques and materials may be specified to be compatible with a particular deposition technology.

View 305 depicts the results of depositing a passivation layer 104 on exposed surfaces such as the top and sides of thermally conductive material regions 106. Passivation layer 104 may include materials such as $SiO_2$, polyimide or silicon nitride. A passivation layer 104 may provide electrical insulation from other adjacent electrically conductive layers, as well as resistance to moisture and corrosion of metals which may be used for thermally conductive regions 106. Photomasking steps may be employed in order to limit passivation coverage to the exposed surfaces of thermally conductive regions 106

View 306 depicts the results of forming capture pads 110 on the back side 102 of chip 116. Capture pads 110 may be formed from a thermally and electrically conductive material such as copper, aluminum, nickel or gold through a patterned deposition process similar to that described in reference to operation 304. A material used in forming capture pads 110 may be chosen to be chemically compatible with interconnection material such as solder. In certain embodiments, capture pads 110 may be deposited directly on exposed ends of TSVs 122, and in certain embodiments capture pads 110 may be offset from the exposed ends of TSVs 122. In embodiments, a width or diameter, of capture pads 110 may be specified to be compatible with the diameter of a specified solder bump. In particular embodiments capture pads 110 may be formed on a back side 102 of chip 116, and in certain embodiments, may be formed on an active device side 120 of chip 116.

View 307 depicts the results of attaching solder bumps 124 to capture pads formed on the active device side 120 of chip 116. Solder bumps 124 may be formed from various metallic alloys which may include metals such as tin, lead, copper, silver, bismuth, indium, zinc and antimony. Solder bumps 124 may be attached to capture pads 110 through a solder reflow process.

Figure 3A:
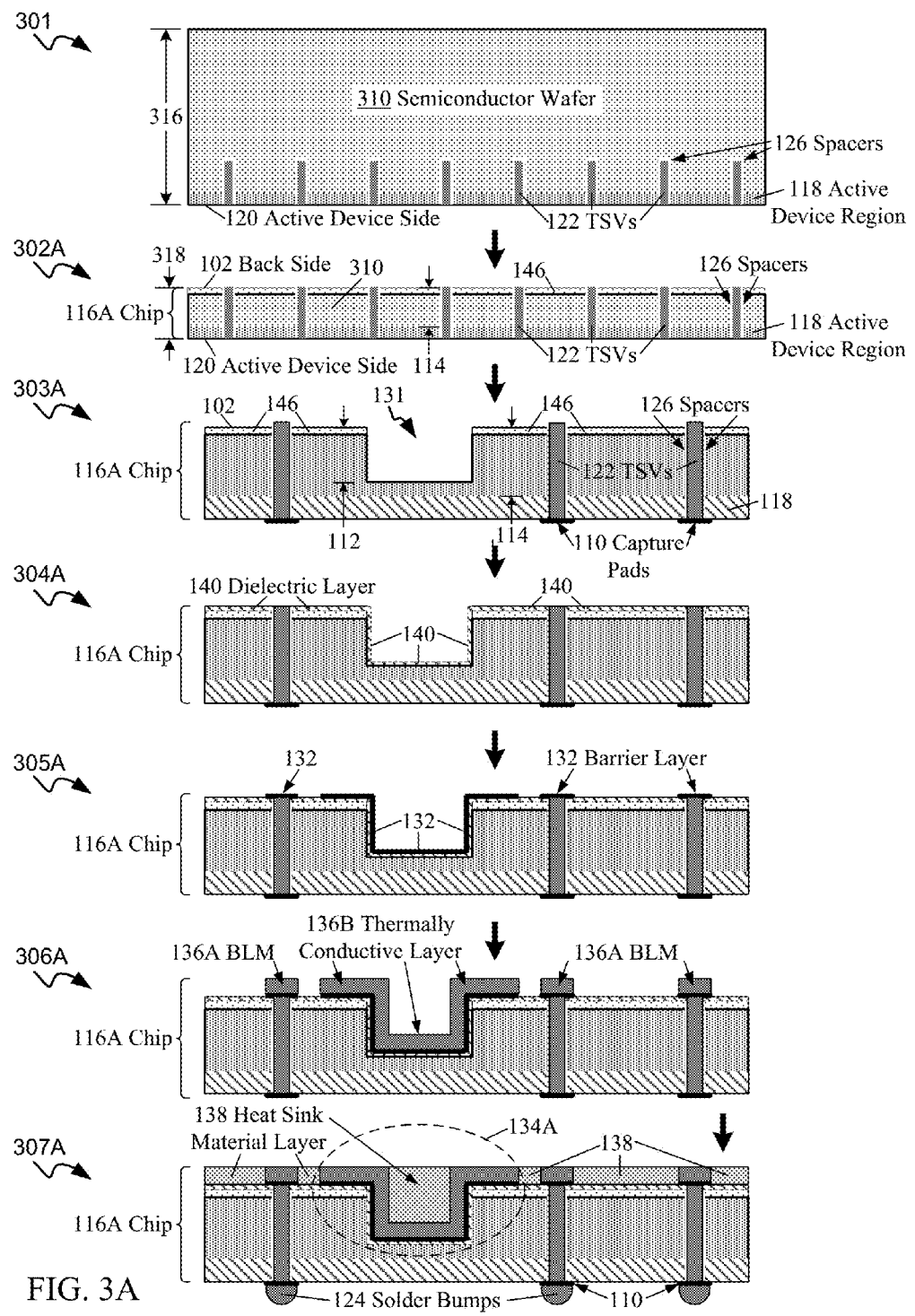
FIG. 3A includes seven cross-sectional views illustrating the results of process steps for fabricating an IC cooling structure, according to embodiments.

FIG. 3A includes seven cross-sectional views 301-307A illustrating the results of a sequential set of process steps for fabricating, within a chip, e.g., 116A, view 302A, a cooling structure for removing heat from the chip, according to embodiments of the present disclosure consistent with the figures, particularly FIG. 3. Processing steps associated with views 301 through 307A may include, but are not limited to, CMP, photomask deposition and patterning, etching, photomask removal, metal and oxide deposition, passivation and solder bump attachment.

The progression depicted in views 301 through 307A begins with a semiconductor wafer 310 with an active device region 118, view 301 and TSVs 122, view 301 and ends with chip 116A, view 307A having a cooling structure including a TCPV 134A, view 307A and TSVs 122, view 303A. For simplicity of illustration, completed structures are generally shown in the views as having rectangular cross-sectional profiles, with surfaces orthogonal to each other. This depiction, however, is not limiting; structures may be of any suitable shape, size and profile, in accordance with specific design criteria, lithographic and assembly process limitations and tolerances for a given application. For example, corners shown as having right angles may be rounded, surfaces may have a non-orthogonal relative orientation, and relative dimensional ratios may vary from those depicted in the figures. Views 301 through 307A illustrate the process of manufacturing a cooling structure in a single chip 116A, however, in embodiments, a plurality of cooling structures may be simultaneously manufactured within multiple chips within a semiconductor wafer, e.g., 310.

View 301 depicts a semiconductor wafer 310, consistent with view 301 of FIG. 3.

View 302A depicts the results of thinning a semiconductor wafer 310 from a first thickness 316 to a second thickness 318 that is less than the first thickness 316. A thinning operation may, for example, involve a CMP process, or other etching or mechanical material removal process. A thinning operation, in a "via first" fabrication process, may expose the TSVs 122 at the back side 102 of the chip 116A. TSVs 122 that are exposed at both an active device side 120 and a back side 102 of the chip 116A may be useful for conducting heat through the chip and conducting electrical signals between chip 116A and an adjacent chip. The first depth 114 represents a distance from back side 102 to an active device region 118 of chip 116A. View 302A also depicts the results of the deposition of a dielectric layer 146 of electrically insulative material such as $SiO_2$ on at least a portion of the back side of chip 116A.

View 303A depicts the results of forming, in the back side 102 of chip 116A, a TCPV recess 131, the recess having a second depth 112, from the back side 102 towards the active devices, that is less than the first depth 114 of active device region 118. Views 303A-307A are depicted as enlarged relative to views 301-302A, in order to depict the details of features such as TCPV recess 131 and TSVs 122. In a "via last" fabrication process, forming the plurality of TSVs may also include forming a respective plurality of TSV recesses.

TCPV recess 131 and TSV recesses may be formed through the use of photomask deposition and patterning, etching, and photomask removal operations. In embodiments, an etching operation may include wet/chemical or dry/plasma etching steps, or an anisotropic etching process. Photomask techniques and materials may be specified to be compatible with a particular etching technology. The duration and resulting depth of an etching operation may be tightly controlled in order to limit the depth 112 of microvia recesses 114 to be less than a depth 114 of the active device region 118.

In certain embodiments, an aspect ratio of the second depth 112 to the width of a recess 131 may be less than 5:1, which may be useful to allow the recess 131 to be relatively easily plated, using known and established plating processes such as electroplating, with thermally conductive material 136B.

In particular embodiments, the recess 131 may have a "V" shaped cross-sectional profile, including two intersecting sloped sides, and may be created by an anisotropic etching process. In certain embodiments, the recess 131 may have a "U" shaped cross-sectional profile, including two sloped sides, each of the sloped sides intersecting with a horizontal bottom surface, and may be created by an anisotropic etching process. The recess 131 may be created using an anisotropic etching process involving tetramethylammonium hydroxide (TMAH), depending on the semiconductor material's structure.

View 304A depicts the results of depositing a layer of electrically insulative dielectric material 140 into the TCPV recess 131 and onto at least a portion, adjacent to the recess 131, of the back side 102 of the chip 116A. The layer of dielectric material 140 may have a thermal conductivity greater than a semiconductor material thermal conductivity, and may be useful for conducting and spreading heat across the back side 102 of chip 116A. In certain embodiments, the layer of dielectric material 140 may include aluminum nitride, which may be deposited using processes such as physical vapor deposition (PVD) and/or Atomic Layer Deposition (ALD).

Depositing a layer of dielectric material 140 may include the use of photomask deposition and patterning, material deposition, and photomask removal operations. Photomask techniques and materials may be specified to be compatible with a particular deposition technology.

View 305A depicts the results of depositing a thermally conductive barrier material layer 132 into the interior of the recess TCPV recess 131 and onto at least a portion, adjacent to the recesses, of the back side 102 of the chip 116A. Thermally conductive barrier material layer 132 may also be deposited over TSVs 122 as a deposition base for subsequent BLM structures.

The barrier material layer 132 may have a thermal conductivity greater than a semiconductor material thermal conductivity, and may be useful for conducting heat from the chip 116 to subsequently deposited thermally conductive layer(s). The barrier material layer 132 may also be useful for inhibiting diffusion of material from a subsequently deposited thermally conductive layer into the semiconductor material used to form chip 116A. In certain embodiments, the barrier material layer 132 may include titanium, titanium nitride or tungsten, which may be deposited using processes such as PVD and/or ALD. In certain embodiments, the thickness of barrier material layer 132 may be less than 1 $\mu m$, and in certain embodiments, the thickness may be in the range of range of 50-100 angstroms.

Depositing a barrier material layer 132 may include the use of photomask deposition and patterning, material deposition, and photomask removal operations. Photomask techniques and materials may be specified to be compatible with a particular deposition technology.

View 306A depicts the results of depositing a thermally conductive material layer 136B onto at least a portion of the barrier layer 132 and into the TCPV recess 131. Thermally conductive material layer 136A may also be deposited over areas of barrier layer 132 on top of TSVs 122 to create BLM structures.

The thermally conductive material layer 136A/136B may have a thermal conductivity greater than a semiconductor material thermal conductivity, and may be useful for conducting heat from the chip 116 to a heat sink or to another chip attached to the top of chip 116A. In certain embodiments, the thermally conductive material layer 136B may include aluminum, or copper, which may be deposited using processes such as PVD, ALD, or electroplating. In certain embodiments, the thickness of thermally conductive material layer 136A/136B may be in the range of 5 $\mu m$-50 $\mu m$.

Depositing a thermally conductive material layer 136A/136B may include the use of photomask deposition and patterning, material deposition, and photomask removal operations. Photomask techniques and materials may be specified to be compatible with a particular deposition technology.

View 307A depicts the results of depositing a heat sink material layer 138 onto at least a portion of the back side 102 of chip 116A, including into at least part of the TCPV recess 131 and between regions of thermally conductive material layer 136A/136B.

The heat sink material layer 138 may have a thermal conductivity greater than a semiconductor material thermal conductivity, and may be useful for conducting heat from the chip 116A to a heat sink or to another chip attached to the top of chip 116A. In certain embodiments, the heat sink material layer 138 may include aluminum nitride which may be deposited using processes such as PVD or ALD.

Depositing a heat sink material layer 138 may include the use of photomask deposition and patterning, material deposition, and photomask removal operations. Photomask techniques and materials may be specified to be compatible with a particular deposition technology. A material removal and/or polishing step may follow the deposition of heat sink material layer 138, in order to create a planar surface, depicted in view 307A, on the top of chip 116A, which may be useful for efficient heat conduction to an adjacent chip or heat sink. Material removal and/or polishing steps may include CMP and/or etching processes such as dry plasma or wet chemical etching.

View 307A also depicts the results of attaching solder bumps 124 to capture pads formed on the active device side 120 of chip 116A. Solder bumps 124 may be formed from various metallic alloys which may include metals such as tin, lead, copper, silver, bismuth, indium, zinc and antimony. Solder bumps 124 may be attached to capture pads 110 through a solder reflow process.

Figure 4:
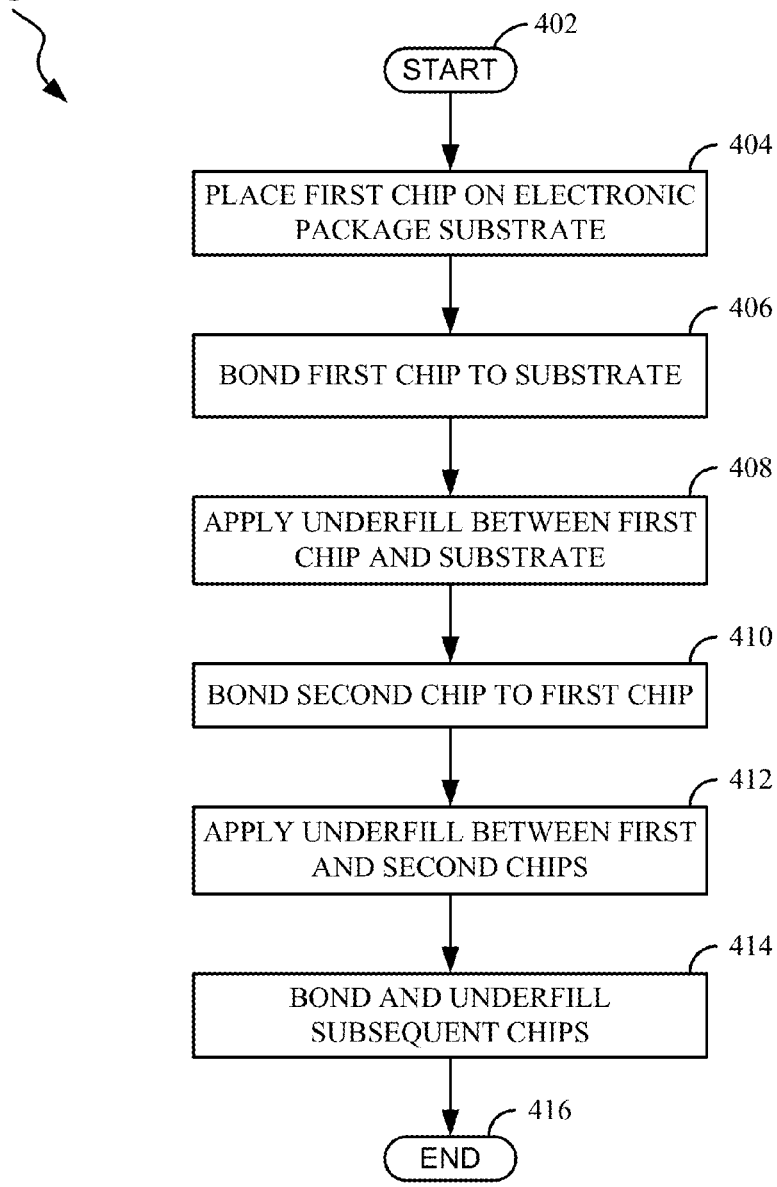
FIG. 4 is a flow diagram of a method for assembling a stacked three-dimensional integrated circuit (3-D IC) including a cooling structure, according to embodiments consistent with the figures.

FIG. 4 is a flow diagram of a method for assembling a stacked three-dimensional integrated circuit (3-D IC) including a composite heat removal structure, according to embodiments consistent with the figures. The heat removal structure may include microvias and a number of thermally conductive material regions, each region in contact with a respective set of the microvias. The structure may also include a number of TSVs. The method for assembling a stacked 3-D IC including a cooling structure 400 may be useful for creating efficient thermal paths useful to remove heat produced by ICs within the 3-D IC structure. The operations of method 400 may generally correspond to FIG. 5 and their associated descriptions. The process 400 moves from start 402 to operation 404.

Figure 5:
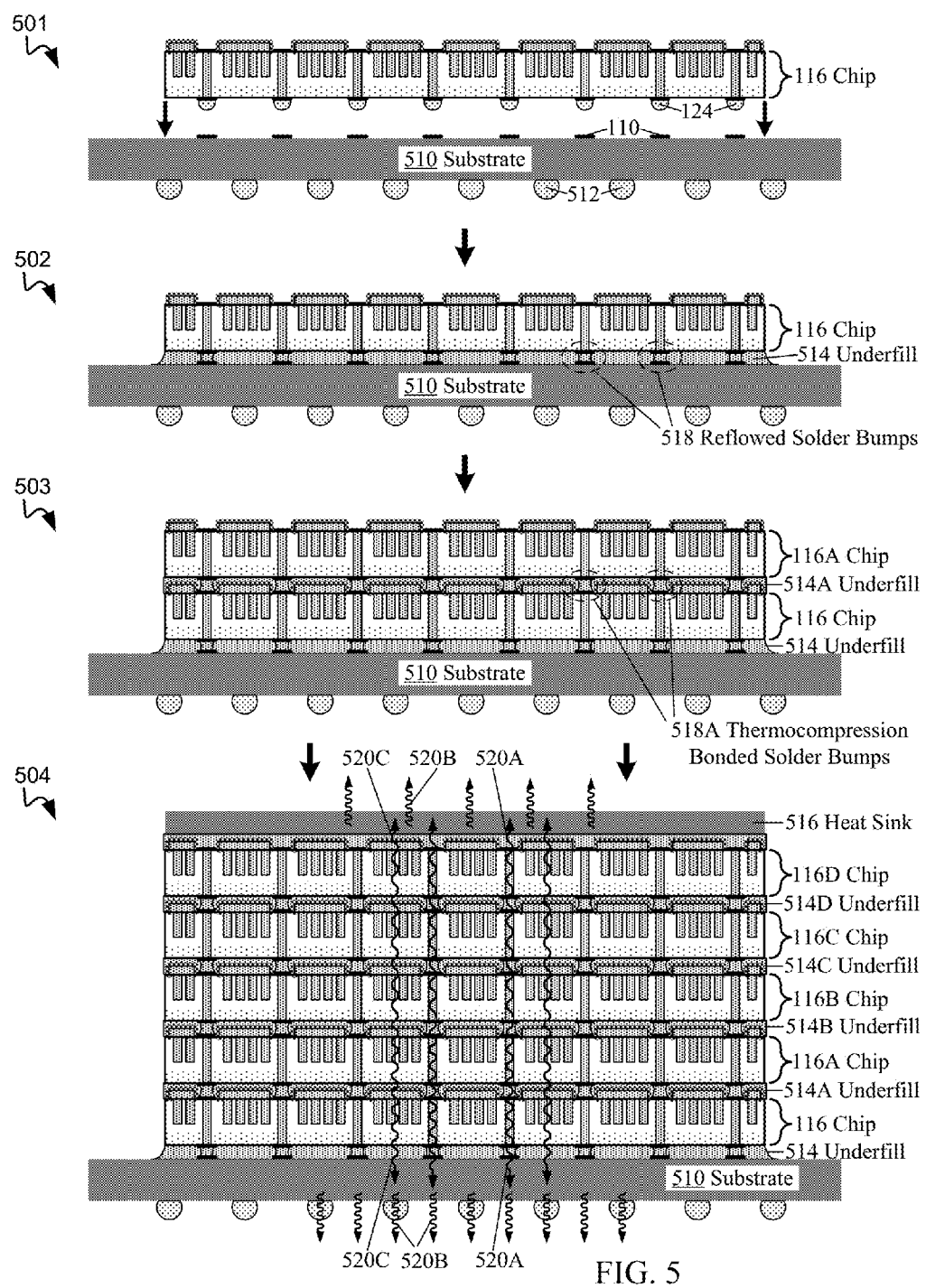
FIG. 5 includes four cross-sectional views illustrating the results of process steps for assembling a stacked 3-D IC including a cooling structure, according to embodiments.

Operation 404 generally refers to the process steps that involve placing, onto a substrate, e.g., 510, FIG. 5, a first chip, e.g., 116, FIG. 5, having a first heat removal structure, as depicted in FIG. 1, which may correspond to view 501, FIG. 5, and its associated description. Alignment of the first chip to the substrate may be useful in creating connections that are mechanically stable and electrically and thermally robust between the first chip and the substrate. Once the first chip has been placed upon the electronic package substrate, the process moves to operation 406.

Operation 406 generally refers to the process steps that involve bonding the first chip, e.g., 116, FIG. 5, to the substrate, e.g., 510, FIG. 5, which may correspond to view 502, FIG. 5, and its associated description. In certain embodiments, bonding the first chip to the substrate may include the use of a solder reflow process which may partially melt solder bumps attached to a capture pads on lower surface of the first chip. The reflow process may cause the solder bump to adhere to capture pads attached to an upper surface of the substrate, creating electrically and thermally conductive connections between corresponding sets of capture pads on the first chip and the substrate. Once the first chip 116 is bonded to the substrate 510, the process moves to operation 408.

Operation 408 generally refers to the process steps that involve depositing underfill material, e.g., 514, FIG. 5, between the substrate, e.g., 510, FIG. 5, and the first chip, e.g., 116, FIG. 5, which may correspond to view 502, FIG. 5, and its associated description. An underfill material may be, for example, an epoxy solution which may fill spaces between the surfaces of an adjacent chip and substrate. Once underfill has been deposited, the process moves to operation 410.

Operation 410 generally refers to the process steps that involve bonding a second chip, e.g., 116A, FIG. 5, to the first chip, e.g., 116, FIG. 5, which may correspond to view 503, FIG. 5, and its associated description. Operation 410 may include an alignment operation as described in reference to operation 404, and a bonding operation. In some embodiments, bonding the second chip to the first chip may include the use of a thermocompression process to bond solder bumps attached to capture pads on a lower surface of the second chip to capture pads attached to an upper surface of the first chip. In particular embodiments, a thermocompression bonding process may include the use of a pre-dispensed underfill material, which may be applied during thermocompression bonding and not as a separate, subsequent processing step. It may be understood that the use of a pre-dispensed underfill material may be used in operation 410, and similarly, in subsequently described operations involving thermocompression bonding. Once the second chip is bonded to the first chip, the process moves to operation 412.

Operation 412 generally refers to the process steps that involve depositing underfill material, e.g., 514A, FIG. 5, between the first chip, e.g., 116, FIG. 5, and the second chip, e.g., 116A, FIG. 5, which may correspond to view 503, FIG. 5, and its associated description. Underfill material may be useful for enhancing the reliability of solder bump connections between adjacent, bonded chips by redistributing stress away from solder joints formed between capture pads formed on the chips and solder bumps. Once underfill has been deposited, the process moves to operation 414.

Operation 414 generally refers to the process steps that involve placing and bonding at least one additional chip, e.g., 116B, 116C, 116D, FIG. 5, onto the second chip, e.g., 116A, FIG. 5, which may correspond to view 504, FIG. 5, and its associated description. Operation 414 may include one or more placement operations, e.g., operation 404, one or more bonding operations, e.g., operation 410, and one or more underfill application operations, e.g., 408, as previously described, in order to create a dense, high-performance 3-D IC structure having a composite, integrated cooling structure. In certain embodiments, operation 414 may also include placing and bonding, onto a top surface of a topmost chip of the 3-D IC, a heat sink or other heat removal device. A heat sink may be useful in dissipating heat generated by chips within the 3-D IC that is conducted by the integrated cooling structure created to the placement and bonding of individual IC's having integrated cooling structures. After at least one additional chip has been placed in bonded onto the second chip 116A, the process 400 may end at block 416.

FIG. 5 includes four cross-sectional views 501-504 illustrating the results of a sequential set of process steps for assembling a stacked 3-D IC, view 504, including a cooling structure, according to embodiments consistent with the figures. These views illustrate an example process; other views and steps may be possible. The results of one or more process steps may be depicted in each view. For example, a view, e.g., 501, may depict the results of placing a chip, e.g., 116, view 501, onto a substrate, e.g., 510, view 501, which may include related chip alignment, placement, reflow soldering, and underfill application operations. Processing steps associated with views 501 through 504 may include, but are not limited to, chip alignment, placement, fluxing, reflow soldering, cooling, cleaning and underfill application operations. In certain embodiments, physical and electrical testing of a stacked 3-D IC, view 504, may be conducted following a series of assembly processes.

The progression depicted in views 501 through 504 begins with chip 116 having attached solder bumps 124 and substrate 510 having capture pads 110, view 501, and ends with for assembling a stacked 3-D IC, view 504, having an integrated cooling structure including microvias 108, view 304, FIG. 3, thermally conductive material 106, view 304, FIG. 3, and TSVs 122, view 303, FIG. 3. For simplicity of illustration, completed structures are generally shown in the views as having rectangular cross-sectional profiles, with surfaces orthogonal to each other. This depiction, however, is not limiting; structures may be of any suitable shape, size and profile, in accordance with specific design criteria, lithographic and assembly process limitations and tolerances for a given application. For example, corners shown as having right angles may be rounded, surfaces may have a non-orthogonal relative orientation, and relative dimensional ratios may vary from those depicted in the figures.

View 501 depicts a first semiconductor chip 116 having a first heat removal structure aligned with a substrate 510. In embodiments, solder bumps 124 that are attached to a lower surface of chip 116 are aligned with capture pads 110, formed on an upper surface of substrate 510. In embodiments, placing a first chip 116 on a substrate 510 may involve aligning the set of solder bumps 124 to the corresponding set of capture pads 110 on substrate 510 before physically contacting the solder bumps 124 to the capture pads 110. In certain embodiments, alignment may include the use of alignment marks on the chip and/or substrate, and in certain embodiments the alignment operation may include the use of manually actuated or automated equipment to achieve precise alignment.

Substrate 510 may be an electronic packaging substrate, which may include one or more layers of conductive material used to form interconnection wires, and electrically insulative dielectric material used to provide insulation between adjacent wires. Substrate 510 may include substrate solder bumps 512, each may be useful for attaching substrate 510 to a printed circuit board (PCB).

View 502 depicts the results of bonding the first chip 116 to the substrate 510, and depositing an underfill material 514 between the substrate 510 and the first chip 116. Bonding the first chip 116 to the substrate 510 may include the use of a solder reflow process, which may involve applying a fluxing/cleaning agent to the top surface of substrate 510 and/or to a bottom surface of chip 116, and subsequent heating of chip 116, solder bumps 124, and substrate 510. Reflowed solder bumps 518 depict solder bumps 124, view 501, after a reflow process that has bonded them to capture pads 110. The reflow process is useful in creating a mechanically stable and electrically and thermally conductive connection between chip 116 and substrate 510. This connection may be useful for conduction of both electrical signals and heat between chip 116 and substrate 510.

Underfill material may be useful for enhancing the reliability of solder bump connections between a chip and a substrate by redistributing mechanical stress away from solder joints formed between solder bumps and capture pads. Underfill material may form a mechanically stable connection between two components that is useful in preventing stress cracks, peeling and other failure mechanisms in solder bumps, capture pads and associated interfaces. In embodiments, stresses between solder bumps and capture pads may result from uneven heating and resulting thermal expansion of an IC within a stacked 3-D IC, relative to another adjacent IC or substrate. In certain embodiments an underfill material may be used to fill gaps between the first chip 116 and the substrate 510, and in certain embodiments, a heat sink material, e.g., 138, FIG. 3A, may be used. In certain embodiments a combination of underfill material and heat sink material 138 may be used to fill gaps between the first chip 116 and the substrate 510.

View 503 depicts the results of aligning and bonding a second chip 116A to the first chip 116, and depositing an underfill material 514A between the first chip 116 and the second chip 116A. Second chip 116A and first chip 116 may be aligned in a process similar to that described in reference to view 501. Bonding the second chip 116A to the first chip 116 may include the use of a thermocompression bonding process, which may involve applying a fluxing/cleaning agent to the top surface of substrate 510 and/or to a bottom surface of chip 116, and subsequent heating and compression of chip 116, solder bumps 124, and substrate 510. The thermocompression process may use a combination of heat and pressure to create electrically and thermally conductive connections between corresponding sets of capture pads on the second chip and the first chip.

Bonded solder bumps 518A depict solder bumps, e.g., 124, view 501, after a thermocompression bonding process that has bonded them to capture pads formed on a top surface of the first chip 116. The thermocompression process may be useful in creating a mechanically stable, electrically and thermally conductive connection between the second chip 116A and the first chip 116. This connection may be useful for conduction of both electrical signals and heat between first chip 116 and second chip 116A.

The thickness of regions of thermally conductive material, e.g., 106, FIG. 1, formed on a back side of chip 116 may be specified to be less than or equal to height of bonded solder bumps 518A in an assembled configuration, view 503, to not interfere with a thermocompression or reflow bonding process. A thermally conductive material region, e.g., 106, FIG. 1, thickness that is specified to be equal to or slightly less than a bonded solder bump 518A height may be useful in creating a thermally efficient interface between adjacent stacked chips. An underfill material 514A may be deposited between second chip 116A and first chip 116, and may be useful for enhancing the mechanical stability and reliability of solder bump connections between the chips.

Aligning, bonding, and depositing underfill between second chip 116A and first chip 116 may be useful for creating a 3-D IC having a composite heat removal structure including the heat removal structure of the first chip mechanically bonded to the heat removal structure of the second chip. The composite heat removal structure may be useful for conductively removing heat generated by ICs within the 3-D IC to either a top or a bottom face of the 3-D IC.

In certain embodiments an underfill material may be used to fill gaps between a second chip 116A and the first chip 116, and in certain embodiments, a heat sink material, e.g., 138, FIG. 3A, may be used. In certain embodiments a combination of underfill material and heat sink material 138 may be used to fill gaps between a second chip 116A and the first chip 116.

View 504 depicts the results of placing and bonding at least one additional chip onto the second chip 116A. The chips 116B, 116C and 116D are subsequently aligned and bonded on the top surface of chip 116A, and underfill material 514B, 514C, 514D is applied between the respective chips. The aligning, reflowing/thermocompression bonding and underfill material deposition processes may be similar to those previously described. In certain embodiments, a heat sink may be placed and bonded on a top surface of a topmost, e.g., 116D, chip of the 3-D IC.

The composite heat removal structure formed by the assembly of the chips 116A, 116B, 116C and 116D onto a substrate 510 may provide efficient thermal paths for conductively removing heat from 3-D IC. For example, thermal paths 520A represent a thermal path using TSVs within each chip that are bonded using solder bumps between the chips. Thermal path 520A may provide a high conductivity path for removing heat from a chip within the 3-D IC to a top surface, or heat sink 516, and to the substrate 510.

Thermal path 520C represents thermal paths through the chips to a top and/or bottom surface of the 3-D IC that have been enhanced through the use of thermally conductive microvias, thermally conductive regions, e.g., 108, 106, respectively, in FIG. 1, and/or TCPVs. The replacement of semiconductor material, e.g., silicon, with a more highly thermally conductive material such as copper or aluminum may cause thermal paths 520C to have an enhanced efficiency over semiconductor material alone. Thermal paths 520B may represent heat radiation, conduction and convection paths from heat sink 516 and substrate 510. In certain embodiments, a thermal path 520B may include a conductive path from substrate 510 through a substrate solder bump 512 into a PCB. In certain embodiments, a thermal path 520B may include a convective path from heat sink 516 into air surrounding the heat sink 516.

Figure 6:
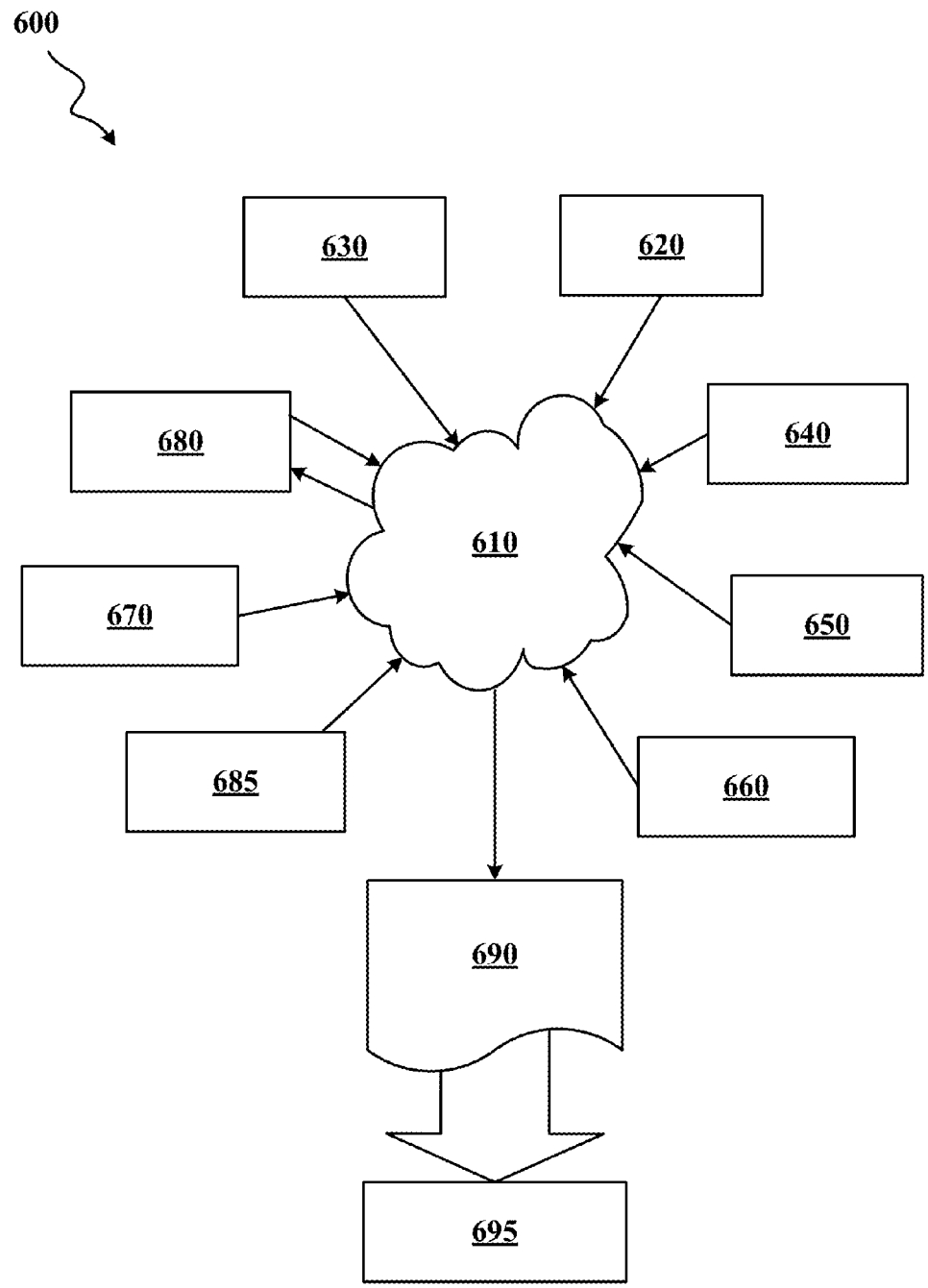
FIG. 6 illustrates multiple design structures including an input design structure that is preferably processed by a design process.

FIG. 6 illustrates multiple design structures 600 including an input design structure 620 that is preferably processed by a design process. Design structure 620 may be a logical simulation design structure generated and processed by design process 610 to produce a logically equivalent functional representation of a hardware device. Design structure 620 may alternatively include data or program instructions that, when processed by design process 610, generate a functional representation of the physical structure of a hardware device. Whether representing functional or structural design features, design structure 620 may be generated using electronic computer-aided design, such as that implemented by a core developer/designer. When encoded on a machine-readable data transmission, gate array, or storage medium, design structure 620 may be accessed and processed by one or more hardware or software modules within design process 610 to simulate or otherwise functionally represent an electronic component, circuit, electronic or logic module, apparatus, device, or system such as those shown in FIG. 1-FIG. 5. As such, design structure 620 may include files or other data structures including human or machine-readable source code, complied structures, and computer-executable code structures that, when processed by a design or simulation data processing system, functionally simulate or otherwise represent circuits or other levels of hardware logic design. Such data structures may include hardware-description language design entities or other data structures conforming to or compatible with lower-level HDL design languages such as Verilog and VHDL, or higher level design languages such as C or C++.

Design process 610 preferably employs and incorporates hardware or software modules for synthesizing, translating, or otherwise processing a design/simulation functional equivalent of the components, circuits, devices, or logic structures shown in FIGS. 2 and 3 to generate a Netlist 680 which may contain design structures such as design structure 620. Netlist 680 may comprise, for example, compiled or otherwise processed data structures representing a list of wires, discrete components, logic gates, control circuits, I/O devices, models, etc., that describe the connections to other elements and circuits in an integrated circuit design. Netlist 680 may be synthesized using an iterative process in which Netlist 680 is resynthesized one or more times depending on design specifications and parameters for the device. As with other design structure types described herein, Netlist 680 may be recorded on a machine-readable data storage medium or programmed into a programmable gate array. The medium may be a non-volatile storage medium such as a magnetic or optical disk drive, a programmable gate array, a compact flash, or other flash memory. Additionally, the medium may be a system or cache memory, buffer space, or electrically or optically conductive devices and materials on which data packets may be transmitted and intermediately stored via the internet, or other suitable networking means.

Design process 610 may include hardware and software modules for processing a variety of input data structure types including Netlist 680. Such data structure types may reside, for example, within library elements 630 and include a set of commonly used elements, circuits, and devices, including models, layouts, and symbolic representations, for a given manufacturing technology, e.g., different technology nodes, 32 nm, 45 nm, 90 nm, etc.). The data structure types may further include design specifications 640, characterization data 650, verification data 660, design rules 650, and test data files 685 which may include input test patterns, output test results, and other testing information. Design process 610 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 610, without deviating from the scope and spirit of the invention. Design process 610 may also include modules for performing standard circuit design processes such as timing analysis, verification, design rule checking, place and route operations, etc.

Design process 610 employs and incorporates logic and physical design tools such as HDL compilers and simulation model build tools to process design structure 620 together with some or all of the depicted supporting data structures, along with any additional mechanical design or data, to generate a second design structure 690. Design structure 690 resides on a storage medium or programmable gate array in a data format used for the exchange of data of mechanical devices and structures, e.g., information stored on an IGES, DXF, Parasolid XT, JT, DRG, or any other suitable format for storing or rendering such mechanical design structures). Similar to design structure 620, design structure 690 preferably comprises one or more files, data structures, or other computer-encoded data or instructions that reside on transmission or data storage media and that, when processed by an ECAD system, generate a logically or otherwise functionally equivalent form of one or more of the embodiments of the invention shown in FIGS. 2 and 3. In one embodiment, design structure 690 may comprise a compiled, executable HDL simulation model that functionally simulates the devices shown in FIGS. 2 and 3.

Design structure 690 may also employ a data format used for the exchange of layout data of integrated circuits and/or symbolic data format, e.g., information stored in a GDSII, GL1, OASIS, map files, or any other suitable format for storing such design data structures). Design structure 690 may comprise information such as symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 2 and FIG. 3. Design structure 690 may then proceed to a state 695 where, for example, design structure 690 proceeds to tape-out, is released to manufacturing, is released to a mask house, is sent to another design house, is sent back to the customer, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A chip fabricated from a semiconductor material, the chip comprising:
   a plurality of active devices located below a first depth from a back side of the chip; and
   a structure configured to remove, by conduction from the plurality of active devices to the back side, heat from the chip, the structure including:
      a plurality of thermally conductive partial vias (TCPVs), each TCPV of the plurality of TCPVs being electrically insulated from the plurality of active devices and having:
         a recess with a second depth, from the back side towards the plurality of active devices, that is less than the first depth;
         a barrier layer deposited within at least a portion of the recess and deposited upon at least a portion, adjacent to the recess, of the back side of the chip, the barrier layer having a barrier layer thermal conductivity greater than a semiconductor material thermal conductivity;
         a thermally conductive layer deposited upon at least a portion of the barrier layer, the thermally conductive layer having a thermal conductivity greater than a semiconductor material thermal conductivity; and
      a plurality of through-silicon vias (TSVs) electrically connected to the plurality of active devices, extending from the back side to an active device side of the chip and configured to remove, by conduction from the active devices to the back side, heat from the chip.

2. The chip of claim 1, further comprising a dielectric layer deposited on at least a portion of the back side of the chip.

3. The chip of claim 1, wherein the thermally conductive layer includes at least one material of a group consisting of: copper and aluminum.

4. The chip of claim 1, wherein the barrier layer includes at least one material of a group consisting of: titanium, titanium nitride and tungsten, to inhibit diffusion of material from the thermally conductive layer into the semiconductor material.

5. The chip of claim 1, further comprising, on the active device side, a plurality of capture pads in an arrangement corresponding to an arrangement of capture pads on a second chip.

6. A method for fabricating, within a chip having a plurality of active devices formed in a semiconductor material and located below a first depth from a back side of the chip, a structure for removing heat from the chip, the method comprising:

forming, in the back side of the chip, a plurality of recesses each having, from the back side towards the plurality of active devices, a second depth that is less than the first depth;

depositing a barrier layer having a barrier layer thermal conductivity greater than a semiconductor material thermal conductivity into the plurality of recesses and onto at least a portion, adjacent to the recesses, of the back side of the chip;

forming, by depositing a thermally conductive layer having a thermal conductivity greater than a semiconductor material thermal conductivity onto at least a portion of the barrier layer, a plurality of thermally conductive partial vias (TCPVs); and forming, in the chip, a plurality of through-silicon vias (TSVs) electrically connected to the plurality of active devices, wherein each TSV extends from the back side to an active side of the chip and is configured to remove heat from the chip.

7. The method of claim 6, wherein the forming of the plurality of recesses further comprises using an anisotropic etch process to create at least one recess having a plurality of intersecting sloped sides.

8. The method of claim 6, wherein the forming of the plurality of recesses further comprises using an anisotropic etch process to create at least one recess having a plurality of sloped sides that each intersect with a bottom side of the recess.

9. The method of claim 6, further comprising depositing a heat sink material layer having a thermal conductivity greater than a semiconductor material thermal conductivity onto the thermally conductive layer, to at least partially fill the recess.

10. The method of claim 6, further comprising thinning the chip, from a first thickness to a second thickness that is less than the first thickness.

11. The method of claim 10, further comprising, in a "via first" fabrication process, thinning the chip to expose the plurality of TSVs at the back side of the chip.

12. The method of claim 6, wherein the forming of the plurality of recesses includes forming at least one recess having a ratio of the second depth to a recess width that is less than 5:1.

13. The method of claim 6, further comprising depositing a dielectric layer having a thermal conductivity greater than a semiconductor material thermal conductivity into the plurality of recesses and onto at least a portion, adjacent to the recesses, of the back side of the chip.

* * * * *